United States Patent
Watanabe et al.

(10) Patent No.: US 8,629,498 B2
(45) Date of Patent: Jan. 14, 2014

(54) POWER SEMICONDUCTOR DEVICE AND METHOD FOR MANUFACTURING THE POWER SEMICONDUCTOR DEVICE

(75) Inventors: Shoyu Watanabe, Tokyo (JP); Shuhei Nakata, Tokyo (JP); Naruhisa Miura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/319,742

(22) PCT Filed: Jul. 15, 2009

(86) PCT No.: PCT/JP2009/003321
§ 371 (c)(1),
(2), (4) Date: Nov. 10, 2011

(87) PCT Pub. No.: WO2011/007387
PCT Pub. Date: Jan. 20, 2011

(65) Prior Publication Data
US 2012/0061688 A1   Mar. 15, 2012

(51) Int. Cl.
*H01L 29/66* (2006.01)

(52) U.S. Cl.
USPC .................. 257/341; 438/286; 257/E29.256; 257/E21.417

(58) Field of Classification Search
USPC .................. 257/335, 339, 341, 287, E29.257, 257/E21.318, 127, 452, E29.256, E21.417, 257/401; 438/226, 227, 228, 232, 233, 286
See application file for complete search history.

(56) References Cited

U.S. PATENT DOCUMENTS

| 4,831,424 A | * | 5/1989 | Yoshida et al. | .................. 257/49 |
| 5,169,793 A | | 12/1992 | Okabe et al. | |

(Continued)

FOREIGN PATENT DOCUMENTS

| JP | 4-229661 | 8/1992 |
| JP | 4-363068 | 12/1992 |

(Continued)

OTHER PUBLICATIONS

International Preliminary Report on Patentability and Written Opinion issued Jan. 26, 2012, in PCT/JP2009/003321 filed Jul. 15, 2009 with English translation.

(Continued)

*Primary Examiner* — Daniel Luke
*Assistant Examiner* — Latanya N Crawford
(74) *Attorney, Agent, or Firm* — Oblon, Spivak, McClelland, Maier & Neustadt, L.L.P.

(57) ABSTRACT

In a power semiconductor device that switches at a high speed, a displacement current flows at a time of switching, so that a high voltage occurs which may cause breakdown of a thin insulating film such as a gate insulating film. A semiconductor device includes: a semiconductor substrate of a first conductivity type; a drift layer of the first conductivity type formed on a first main surface of the semiconductor substrate; a first well region of a second conductivity type formed in a part of a surface layer of the drift layer; a second well region of the second conductivity type formed in a part of the surface layer of the drift layer at a distance from the first well region, the second well region having a smaller area than that of the first well region when seen above an upper surface thereof; a low-resistance region of the first conductivity type formed in a surface layer of the first well region, the low-resistance region having a higher impurity concentration than that of the first well region; a gate insulating film formed on and in contact with a surface of the first well region; and a gate electrode formed on and in contact with a surface of the gate insulating film.

6 Claims, 8 Drawing Sheets

(56) References Cited

U.S. PATENT DOCUMENTS

| | | | |
|---|---|---|---|
| 5,208,471 A * | 5/1993 | Mori et al. | 257/327 |
| 5,250,449 A * | 10/1993 | Kuroyanagi et al. | 438/137 |
| 5,313,088 A | 5/1994 | Takahashi et al. | |
| 5,464,992 A | 11/1995 | Okabe et al. | |
| 5,521,409 A * | 5/1996 | Hshieh et al. | 257/341 |
| 5,767,550 A * | 6/1998 | Calafut et al. | 257/355 |
| 6,104,060 A * | 8/2000 | Hshieh et al. | 257/329 |
| 6,313,504 B1 * | 11/2001 | Furuta et al. | 257/335 |
| 6,603,173 B1 * | 8/2003 | Okabe et al. | 257/330 |
| 6,747,315 B1 * | 6/2004 | Sakamoto | 257/341 |
| 7,189,608 B2 * | 3/2007 | Venkatraman et al. | 438/218 |
| 2004/0183080 A1 * | 9/2004 | Kusumoto et al. | 257/77 |
| 2006/0049459 A1 * | 3/2006 | Aida et al. | 257/341 |
| 2008/0121993 A1 * | 5/2008 | Hefner et al. | 257/341 |
| 2011/0210392 A1 | 9/2011 | Nakata et al. | |
| 2011/0284874 A1 | 11/2011 | Miura et al. | |

FOREIGN PATENT DOCUMENTS

| | | |
|---|---|---|
| JP | 5-198816 | 8/1993 |
| JP | 08-102495 | 4/1996 |
| JP | 2007-012684 | 1/2007 |
| JP | 2009-016530 | 1/2009 |

OTHER PUBLICATIONS

International Search Report issued Sep. 8, 2009, in PCT/JP2009/003321.

Office Action issued Sep. 3, 2013, in Japanese Patent Application No. 2011-522623, issued Aug. 27, 2013 (with English-language Partial Translation), 7 pages.

\* cited by examiner

F I G. 3
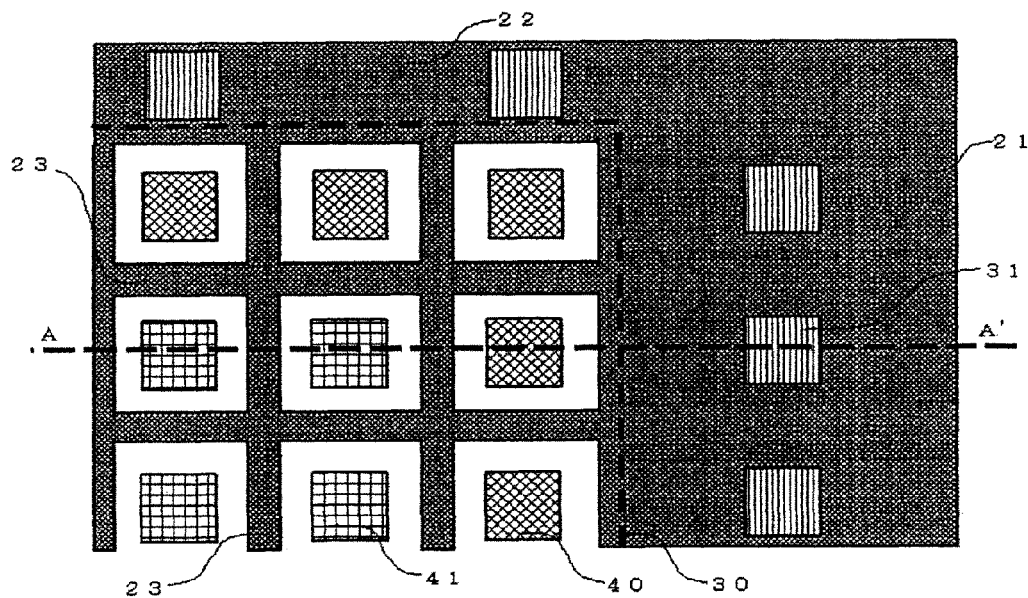
F I G. 4
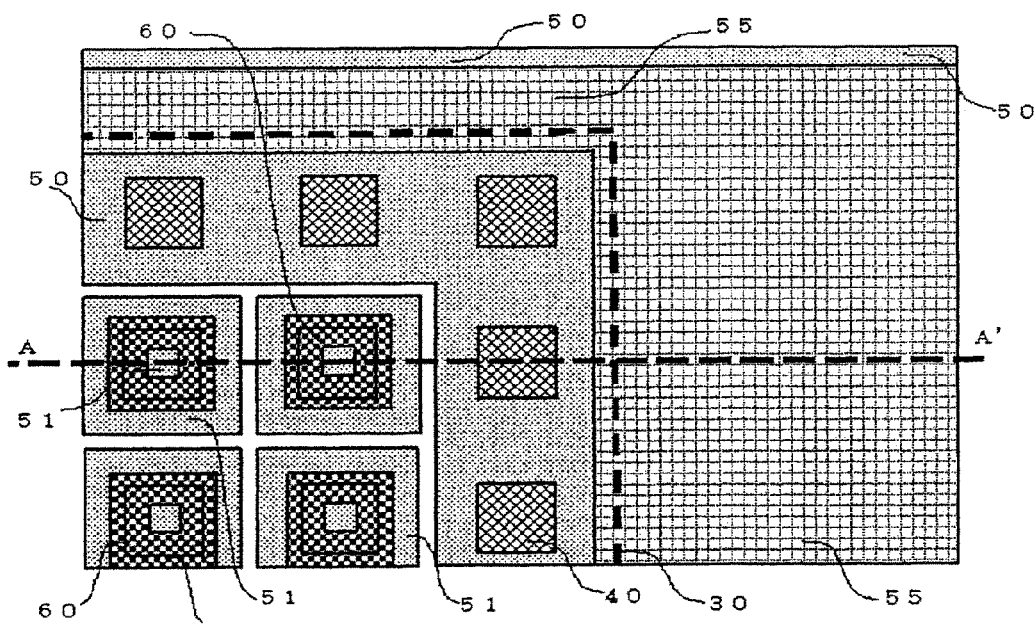

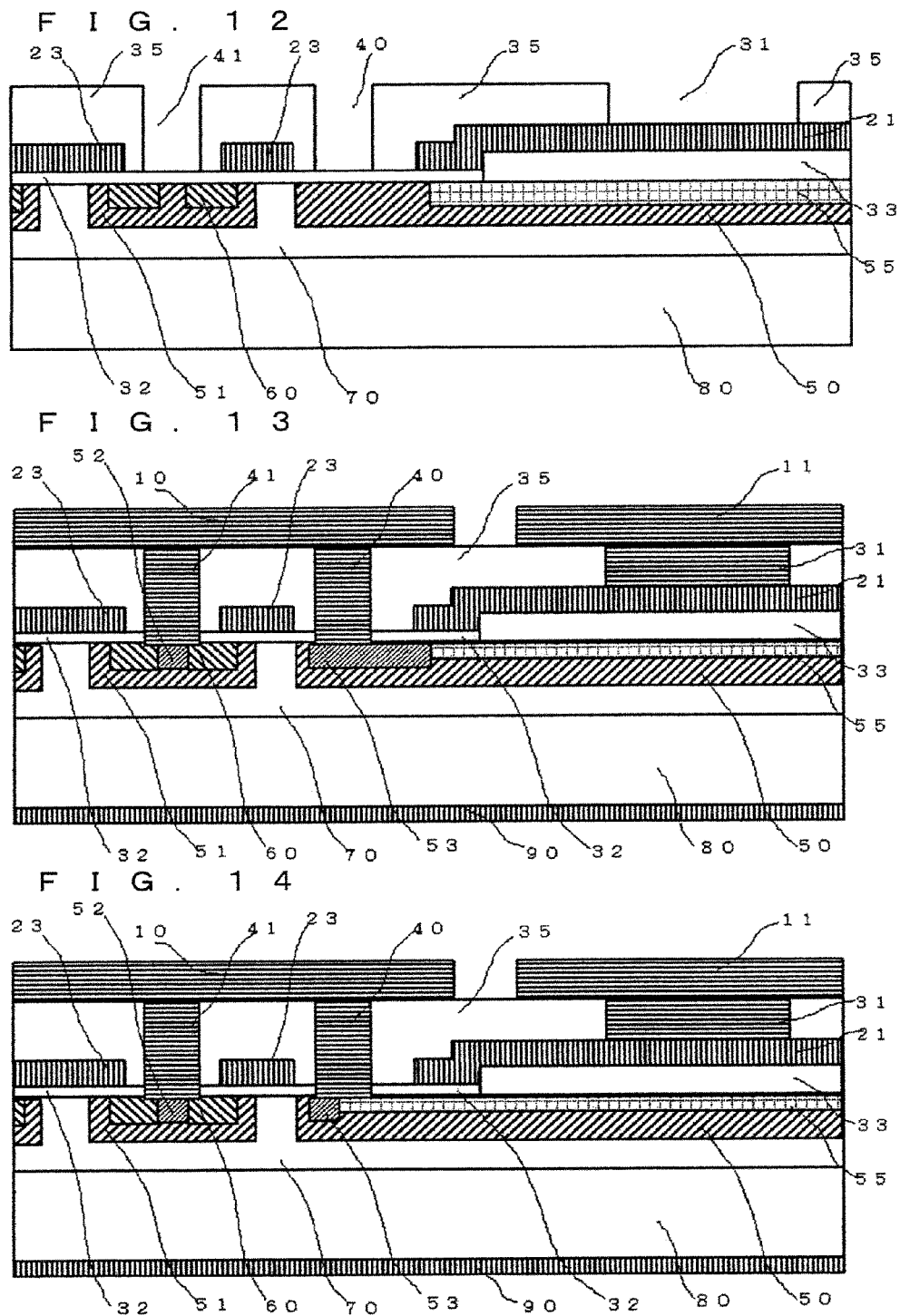

F I G . 1 5
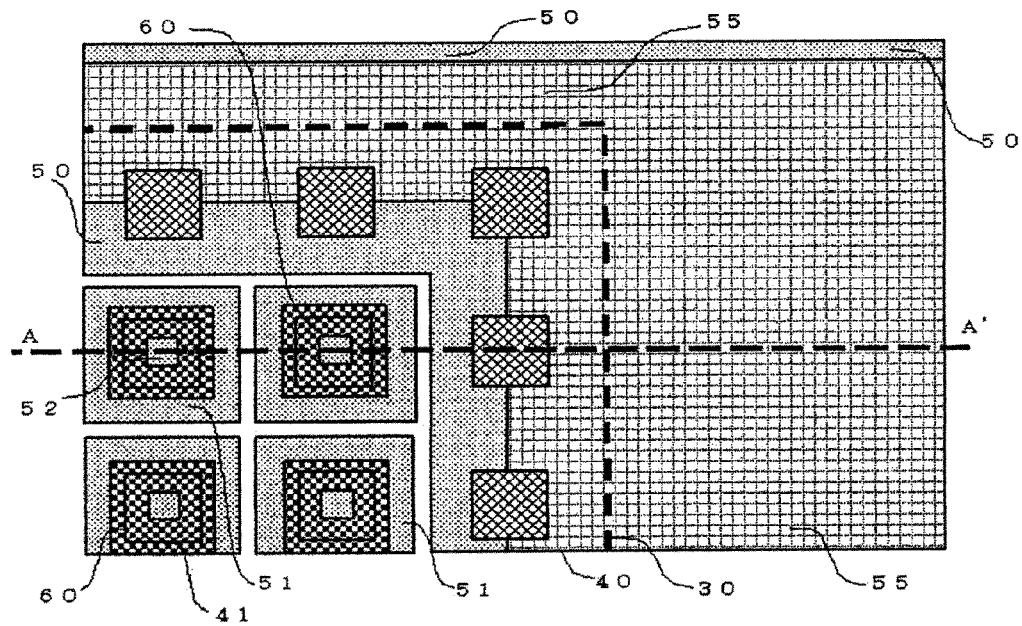
F I G . 1 6
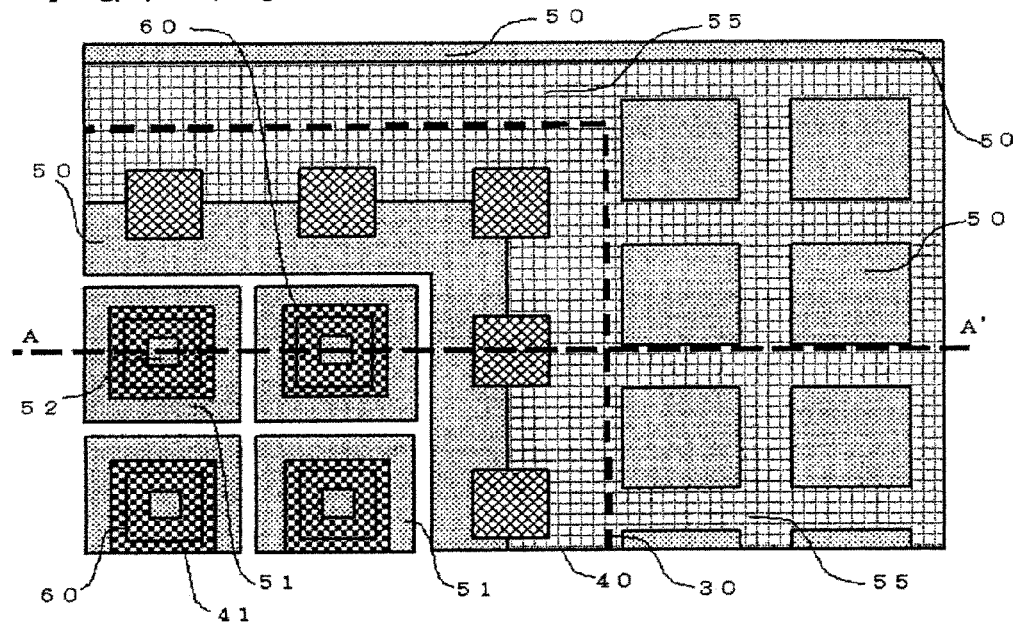

POWER SEMICONDUCTOR DEVICE AND METHOD FOR MANUFACTURING THE POWER SEMICONDUCTOR DEVICE

TECHNICAL FIELD

The present invention relates to a power semiconductor device such as a silicon carbide power semiconductor device.

BACKGROUND ART

In a power semiconductor device such as a vertical power metal oxide semiconductor field effect transistor (MOSFET) disclosed in Patent Document 1, as shown in FIGS. 1 and 2 of the Document, diodes are arranged in a line in a region adjacent to a peripheral portion of a cell region of the MOSFET, that is, to a gate pad portion. At a time when the MOSFET switches from the ON state to the OFF state, each of the diodes absorbs a hole that has been, at a time of forward biasing, injected into an N-type semiconductor layer at the drain side of a well and a P-base shown in FIG. 2 of the Document. Therefore, the above-mentioned structure shown in the Document can prevent a parasitic transistor shown in FIG. 3 of the Document from turning on at a time when the MOSFET switches from forward bias to reverse bias, thus preventing destruction of an element due to a high current concentration.

In the above-mentioned structure of the Document, as shown in FIG. 2, the P-base that is a well of the MOSFET is electrically connected to a source electrode via a back gate.

A method is also known in which breakdown is suppressed by electrically connecting a P-type diffusion region having a large area of a power semiconductor device to neither of the gate and the source (for example, Patent Document 2).

[Patent Document 1] Japanese Patent Application Laid-Open No. 1993-198816 (FIGS. 1 to 3)

[Patent Document 2] Japanese Patent Application Laid-Open No. 1992-363068 (FIG. 1)

DISCLOSURE OF THE INVENTION

Problems to be Solved by the Invention

Problems to be solved by the present invention will be described below with reference to FIG. 2 of the Patent Document 1.

In the Patent Document 1, when the MOSFET of the power semiconductor device switches from the ON state to the OFF state, a drain voltage, in other words, a voltage of a drain electrode, of the MOSFET rapidly rises and, in some cases, may reach approximately several hundred V. This causes a displacement current to flow into a P-well through a parasitic capacitance existing between the P-well and an N-drain layer. The displacement current occurs not only in the well of the MOSFET but also in a diode, as long as a P-well or a P-type region similar to a P-well is provided in an N-drain layer.

In the displacement current occurring in this manner, the one occurring at the drain electrode side directly flows to the drain electrode, while the one occurring at the source electrode side flows to the source electrode via the p-well or the P-type region. At this time, a voltage equivalent to the product of a resistance value of the well or the P-type region and a displacement current value occurs. If the resistance value of the well or the P-type region is high, the occurring voltage has a high value.

In a case of using silicon carbide for the power semiconductor device, the resistance of the P-well may not be sufficiently lowered, and additionally a high voltage may occur due to an increase in the value of the contact resistance between this p-well and an electrode connected to this p-well.

Particularly, in a case of a large-area p-well such as a p-well located below the gate pad of the power semiconductor device, a portion of a high resistance occurs in the way to the source electrode. If a variation in the drain voltage V relative to a time t, represented as dV/dt, is large, a higher voltage occurs.

In the power semiconductor device as disclosed in the Patent Document 1, the source electrode and a field plate are electrically connected each other. Therefore, in a cross-section shown in FIG. 2(C) for example, the displacement current flowing into the p-well located below the gate pad, flows in the p-well located below the gate pad in a direction from a MOSFET cell to a contact hole connected to a field plate, and flows into the source electrode through the field plate.

As a result, as shown in FIG. 2(C) of the Patent Document 1, if a gate electrode is provided, with interposition of a gate insulating film, in the p-well located below the gate pad and at a position distant from the contact hole, immediately after the MOSFET cell switches from the ON state to the OFF state, a high electric field is applied to the gate insulating film between the gate electrode having a voltage close to 0V and the p-well located under the gate pad at the position distant from the contact hole, which may result in breakdown of the gate insulating film.

The present invention is made to solve these problems, and an object of the present invention is to provide a power semiconductor device including a high-speed switching MOSFET and capable of suppressing occurrence of breakdown between a gate electrode and a source electrode at a time of switching.

Means for Solving the Problems

A power semiconductor device of the present invention includes: a semiconductor substrate of a first conductivity type; a drift layer of the first conductivity type formed on a first main surface of the semiconductor substrate; a first well region of a second conductivity type formed in a part of a surface layer of the drift layer; a second well region of the second conductivity type formed in a part of the surface layer of the drift layer at a distance from the first well region, the second well region having a smaller area than that of the first well region when seen above an upper surface thereof; a low-resistance region of the first conductivity type formed in a surface layer of the first well region; a gate insulating film formed on and in contact with surfaces of the first well region and the low-resistance region; and a gate electrode formed on and in contact with a surface of the gate insulating film.

Effects of the Invention

In the power semiconductor device of the present invention, even when the power semiconductor device is driven at a high speed, application of a high-intensity electric field to the gate insulating film can be prevented, and thus breakdown of the gate insulating film can be suppressed, so that a switching operation at a higher speed is achieved.

BRIEF DESCRIPTION OF THE DRAWINGS

FIG. 3 is a plan view schematically showing a part of the power semiconductor device according to the embodiment 1 of the present invention.

FIG. 4 is a plan view schematically showing a part of the power semiconductor device according to the embodiment 1 of the present invention.

FIG. 12 is a cross-sectional view for explaining the manufacturing process of the power semiconductor device according to the embodiment 1 of the present invention.

FIG. 13 is a cross-sectional view schematically showing a part of the power semiconductor device according to the embodiment 1 of the present invention.

FIG. 14 is a cross-sectional view schematically showing a part of the power semiconductor device according to the embodiment 1 of the present invention.

FIG. 15 is a plan view schematically showing a part of the power semiconductor device according to the embodiment 1 of the present invention.

FIG. 16 is a plan view schematically showing a part of the power semiconductor device according to the embodiment 1 of the present invention.

Figure 1:
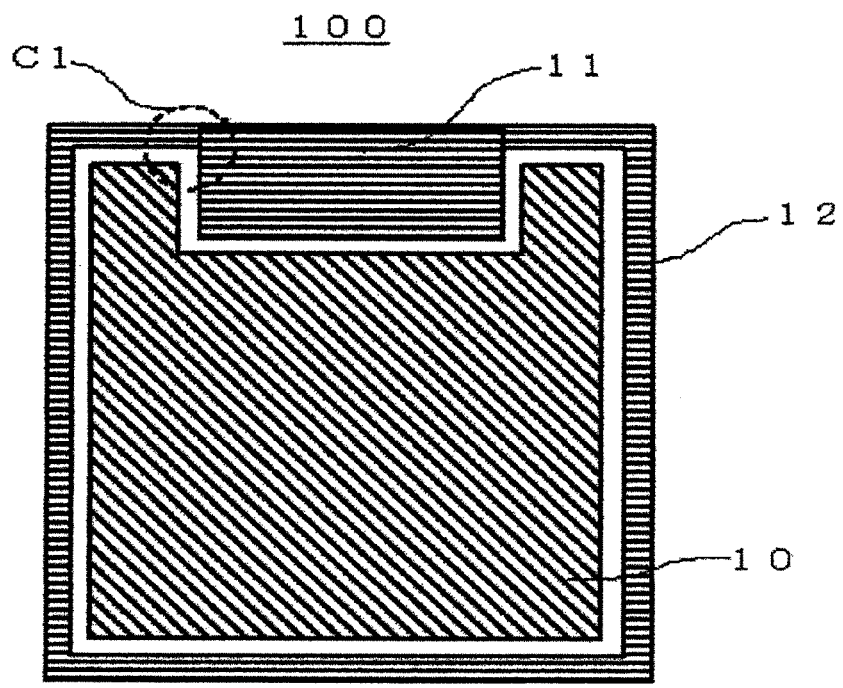
FIG. 1 is a plan view schematically showing a power semiconductor device according to an embodiment 1 of the present invention.

DESCRIPTION OF THE REFERENCE NUMERALS 10 source electrode pad; 11 gate electrode pad; 12 gate finger; 21, 22, 23 gate electrode; 31 interlayer insulating film contact hole; 32 gate insulating film; 33 field oxide film; 35 interlayer insulating film; 40 well contact hole; 41 source contact hole; 50 first well region; 51 second well region; 52, 53 p-contact region; 55 low-resistance region; 56 channel epitaxial layer; 58 n-contact region; 60 source region; 70 drift layer; 80 substrate; 90 drain electrode; 100 power semiconductor device

BEST MODE FOR CARRYING OUT THE INVENTION (Embodiment 1)

In a description of an embodiment 1 of the present invention, a vertical n-channel silicon carbide MOSFET is used as an example of a power semiconductor device 100. In the description, a first conductivity type is n-type and a second conductivity type is p-type.

FIG. 1 is a plan view schematically showing the power semiconductor device 100 according to the embodiment 1 of the present invention, as seen from an upper surface side thereof. In FIG. 1, a source electrode pad 10 is provided in a central portion of an upper surface of the power semiconductor device 100, and a gate electrode pad 11 is provided at one side of the source electrode pad 10. A gate finger 12 extending from the gate electrode pad 11 is provided so as to surround the source electrode pad 10. A gap is formed between the source electrode pad 10 and the gate electrode pad 11 and between the source electrode pad 10 and the gate finger 12 in order to prevent short-circuiting therebetween.

Figure 2:
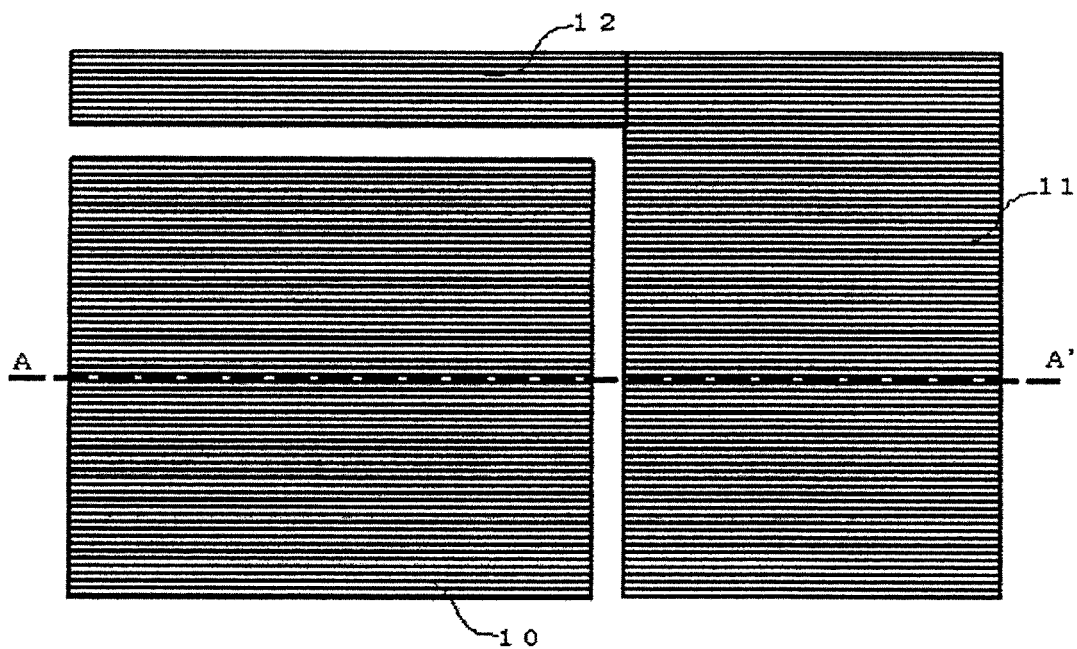
FIG. 2 is a plan view schematically showing a part of the power semiconductor device according to the embodiment 1 of the present invention.
Figure 5:
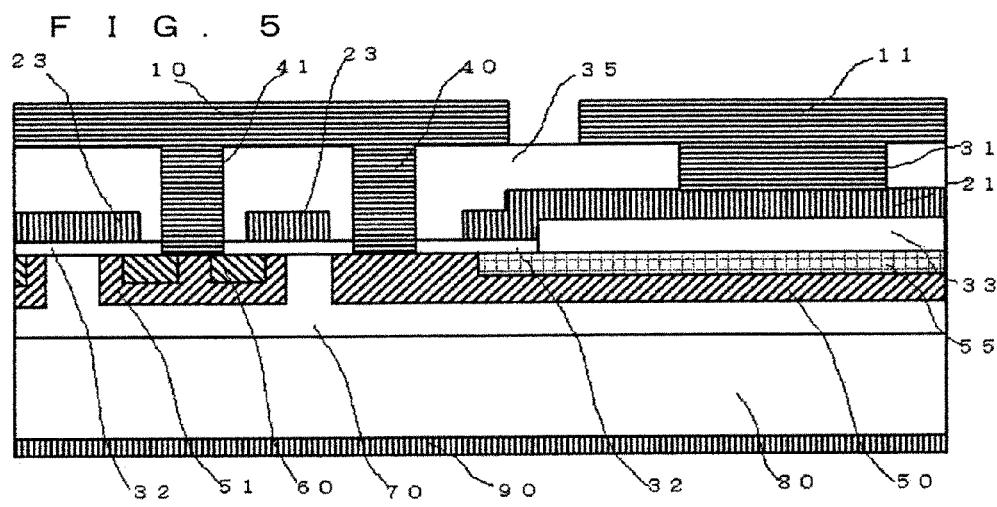
FIG. 5 is a cross-sectional view schematically showing a part of the power semiconductor device according to the embodiment 1 of the present invention.

FIG. 2 is a plan view showing on an enlarged scale a part near a connection between the gate electrode pad 11 and the gate finger 12 of FIG. 1, in which a corner portion C1 of FIG. 1 is enlarged. FIGS. 3 and 4 are plan views schematically showing a configuration of an underlayer of the source electrode pad 10 and the gate electrode pad 11 of FIG. 2. FIG. 5 is a cross-sectional view schematically showing a cross-section taken along the line A-A' of FIGS. 2 to 4.

The power semiconductor device 100 according to this embodiment will be described with reference to FIGS. 2 to 5.

Referring to FIG. 3, in a portion corresponding to a lower portion of the gate electrode pad 11 and the gate finger 12 of FIG. 2, gate electrodes 21 and 22 are provided substantially throughout a surface with interposition of an interlayer insulating film which is not shown, and interlayer insulating film contact holes 31 that are defined by not providing the interlayer insulating film are discretely formed.

Referring to FIG. 3, in a portion corresponding to a lower portion of the source electrode pad 10, an interlayer insulating film which is not shown is formed substantially throughout a surface, and in a portion corresponding to an outer peripheral portion of the source electrode pad 10, well contact holes 40 are discretely formed in the interlayer insulating film, and in an inside portion of the source electrode pad 10, source contact holes 41 are discretely formed in the interlayer insulating film. In the portion corresponding to the lower portion of the source electrode pad 10, except where the well contact holes 40 and the source contact holes 41 are formed, a gate electrode 23 is formed in a grid pattern under the interlayer insulating film. The gate electrode 23 is electrically connected to the gate electrodes 21 and 22 provided under the gate electrode pad 11 and the gate finger 12. A field oxide film which is not shown is provided in most of a region of an underlayer of the interlayer insulating film and the gate electrodes 21 and 22 provided under the gate electrode pad 11 and the gate finger 12. A gate insulating film which is not shown is provided in most of a region of an underlayer of the interlayer insulating film and the gate electrode 23 provided under the source electrode pad 10. The gate insulating film has a smaller thickness than that of the field oxide film, and in FIG. 3, a boundary between the gate insulating film and the field oxide film, in other words, a gate-insulating-film/field-oxide-film boundary 30, is illustrated with a dotted line.

FIG. 4 is for explaining a region made of silicon carbide and located mainly in an underlayer of the gate insulating film and the field oxide film of FIGS. 2 and 3. As shown in FIG. 4, a first well region 50 of p-type that is made of silicon carbide is provided so as to extend from the region in the underlayer of the field oxide film to a plane region across the well contact holes 40. In each of the source contact holes 41, a second well region 51 of p-type is provided in a central portion of the source contact hole 41, a source region 60 of n-type is provided so as to surround the second well region 51 in a plane, and further a second well region 51 of p-type is provided on an outer periphery thereof. The second well regions 51 at the central portion and the outer periphery are connected to each other under the source region 60. The second well regions 51 of the adjacent source contact holes 41 are connected to each other via a drift layer of n-type that is made of silicon carbide.

A low-resistance region 55 of n-type having a low resistance is provided inside the first well region 50.

Next, the configuration described with reference to FIGS. 2 to 4 will be described based on a cross-sectional direction with reference to FIG. 5.

Referring to FIG. 5, a drift layer 70 of n-type that is made of silicon carbide is formed on a substrate 80 of n-type having a low resistance that is made of silicon carbide. The first well region 50 of p-type that is made of silicon carbide is provided in a region corresponding substantially to a surface layer portion of the drift layer 70 in a region where the gate electrode 21 is formed. The low-resistance region 55 of n-type having a low resistance to which an impurity is added so as to provide a higher carrier density than that of the first well region 50 is provided within the first well region 50 at the surface layer side.

In a region centered at a surface layer portion of the drift layer 70 under a region where each of the source contact holes 41, the second well region 51 of p-type that is made of silicon carbide is provided in the central portion of the source contact hole 41, the source region 60 of n-type having a low resistance that is made of silicon carbide is provided so as to surround the second well region 51, and further the second well region 51 of p-type is provided at the outer periphery side thereof.

A gate insulating film 32 made of silicon dioxide is formed above a region of a silicon carbide layer corresponding substantially to a region where the source electrode pad 10 is provided. A field oxide film 33 made of silicon dioxide is formed above a region of the silicon carbide layer corresponding to the gate electrode pad 11 and the gate finger 12 and except a region where the gate insulating film 32 is formed. The gate electrode 21 is provided partially above the field oxide film 33.

The gate electrode 23 is provided above a part the gate insulating film 32 where the second well region 51 is in contact with the gate insulating film 32, and is electrically connected to the gate electrode 21 provided on the field oxide film 33.

An interlayer insulating film 35 is formed in most of a region above the gate insulating film 32, the field oxide film 33, and the gate electrodes 21, 22, and 23. Through the source contact holes 41 formed through the interlayer insulating film 35, the second well regions 51 and the source regions 60 are electrically connected to the source electrode pad 10. Through the well contact holes 40 formed through the interlayer insulating film 35, the first well regions 50 are electrically connected to the source electrode pad 10. Additionally, through the interlayer insulating film contact holes 31 formed through the interlayer insulating film 35, the gate electrode 21 is electrically connected to the gate electrode pad 11.

A drain electrode 90 is formed on the back surface side of the substrate 80.

Here, a diode is formed between the first well region 50 of p-type that is connected to the source electrode pad 10 through the well contact hole 40 and the drift layer 70 of n-type that is connected to the drain electrode 90 through the substrate 80. In a vertical type MOSFET, electrical conduction in a region of the second well region 51 of p-type between the source region 60 of n-type and the drift layer 70 of n-type that is in contact with the gate insulating film 32 can be controlled by a voltage of the gate electrode 23 provided above the gate insulating film 32. In the power semiconductor device of this embodiment, a diode is connected in parallel between the source and the drain of the MOSFET.

Next, a method for manufacturing the power semiconductor device according to this embodiment will be described with reference to FIGS. 6 to 12.

Figure 6:
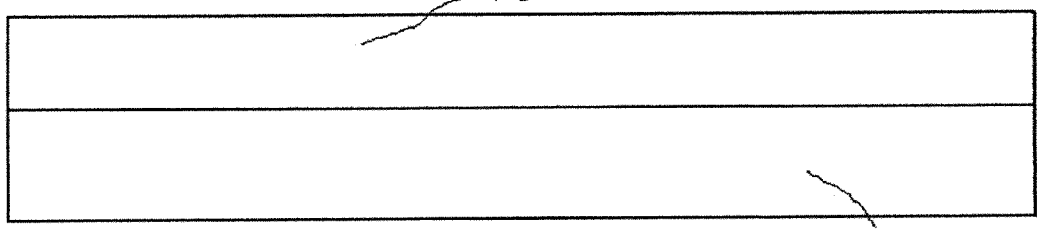
FIG. 6 is a cross-sectional view for explaining a manufacturing process of the power semiconductor device according to the embodiment 1 of the present invention.
Figure 7:
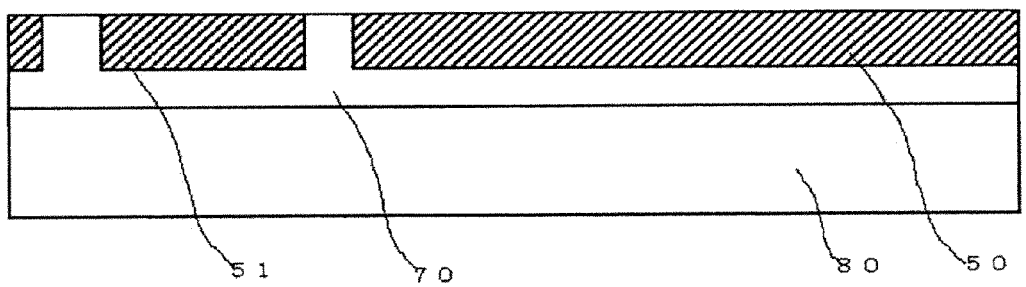
FIG. 7 is a cross-sectional view for explaining the manufacturing process of the power semiconductor device according to the embodiment 1 of the present invention.

Firstly, as shown in FIG. 6, by a chemical vapor deposition (CVD) process, the drift layer 70 of n-type is epitaxially grown on the substrate 80 of n-type having a low resistance that is made of silicon carbide. The drift layer 70 is made of silicon carbide having an impurity concentration of $1 \times 10^{13}$ cm$^{-3}$ to $1 \times 10^{18}$ cm$^{-3}$ and a thickness of 5 to 200 μm. Subsequently, while a photoresist is formed on a region of a surface of the drift layer 70 where the first well region 50 and the second well region 51 are not to be formed, Al (aluminum) which is a p-type impurity is ion implanted, to thereby form the first well region 50 and the second well region 51 having a p-type impurity concentration of approximately $1 \times 10^{17}$ cm$^{-3}$ to $1 \times 10^{19}$ cm$^{-3}$, as shown in FIG. 7. The depth of the first well region 50 and the second well region 51 is set to approximately 0.5 to 3 μm not exceeding the thickness of the drift layer 70.

Figure 8:
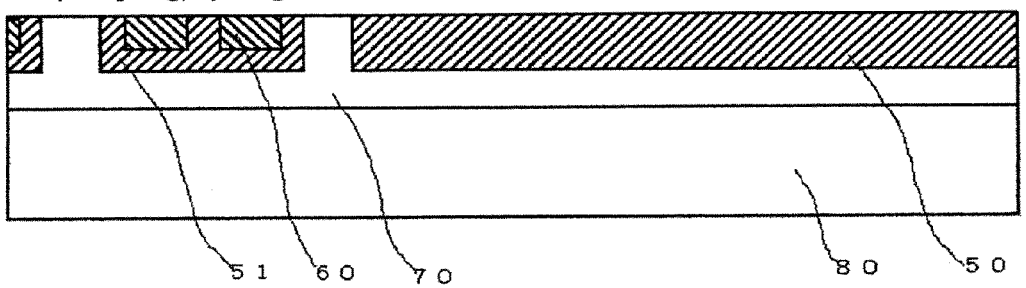
FIG. 8 is a cross-sectional view for explaining the manufacturing process of the power semiconductor device according to the embodiment 1 of the present invention.

Then, after the aforementioned photoresist is removed, another photoresist is formed on a region of the surface of the drift layer 70 where the source region 60 is not to be formed, and in this state, N (nitrogen) which is an n-type impurity is ion implanted, to thereby form the source region 60 having an n-type impurity concentration of approximately $1 \times 10^{18}$ cm$^{-3}$ to $1 \times 10^{21}$ cm$^{-3}$, as shown in FIG. 8. The depth of the source region 60 is set to be less than the thickness of the second well region 51.

Figure 9:
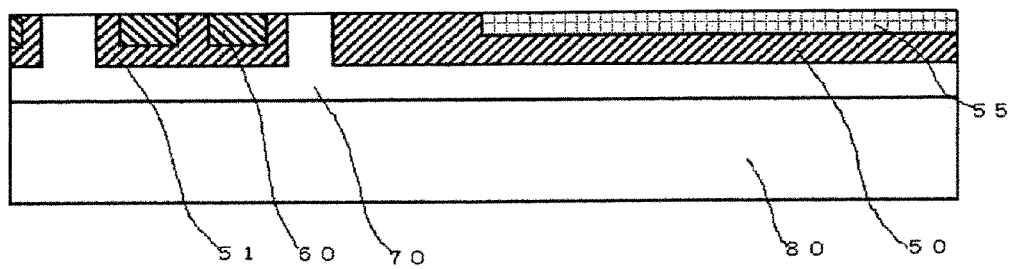
FIG. 9 is a cross-sectional view for explaining the manufacturing process of the power semiconductor device according to the embodiment 1 of the present invention.

Then, after the aforementioned photoresist is removed, another photoresist is formed on a region of the surface of the drift layer 70 where the low-resistance region 55 is not to be formed, and in this state, N (nitrogen) which is an n-type impurity is ion implanted, to form the low-resistance region 55 having an n-type impurity concentration of approximately $1 \times 10^{20}$ cm$^{-3}$ to $1 \times 10^{21}$ cm$^{-3}$, as shown in FIG. 9. The thickness of the low-resistance region 55 is set to, for example, approximately 1 to 500 nm.

Then, after the photoresist is removed, an annealing process is performed in an inert gas atmosphere such as an argon (Ar) gas atmosphere at 1300 to 1900° C. for 30 minutes to one hour, to activate the N and Al that have been ion implanted.

Figure 10:
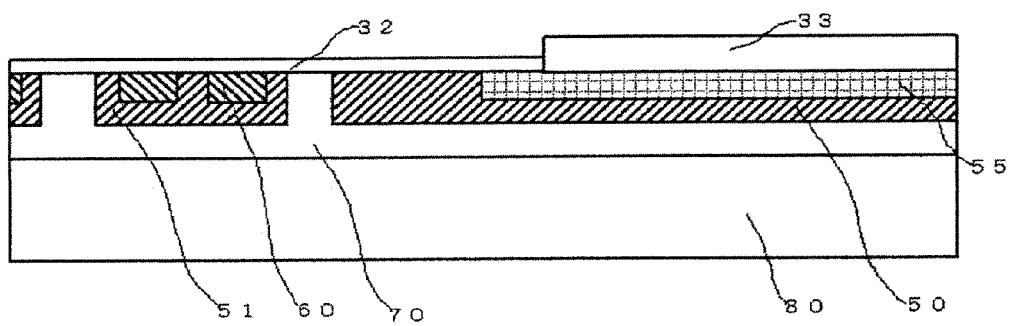
FIG. 10 is a cross-sectional view for explaining the manufacturing process of the power semiconductor device according to the embodiment 1 of the present invention.

Then, field oxide is caused while a silicon nitride film is selectively formed by a plasma CVD process or the like on a region of a surface of a silicon carbide layer such as the drift layer 70 where the field oxide film 33 is not to be formed, to thereby form the field oxide film 33 made of silicon dioxide. Then, after the silicon nitride film is removed, thermal oxidation is performed so that the gate insulating film 32 made of silicon dioxide is formed on a region of the surface of the drift layer 70 where the field oxide film 33 is not formed (FIG. 10).

Figure 11:
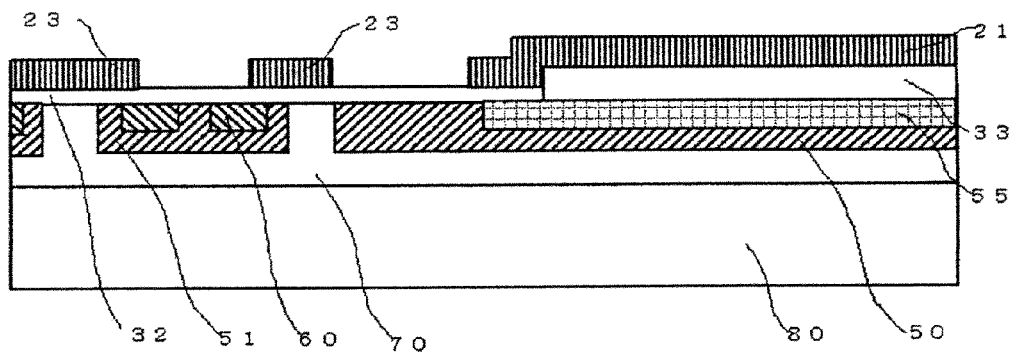
FIG. 11 is a cross-sectional view for explaining the manufacturing process of the power semiconductor device according to the embodiment 1 of the present invention.

Then, as shown in FIG. 11, the gate electrodes 21 to 23 made of a polycrystalline silicon material having a low resistance are formed at predetermined positions by using a CVD process, a photolithographic technique, or the like. Then, as shown in FIG. 1, the interlayer insulating film 35 made of silicon dioxide is formed 2 by a CVD process. Then, portions of the interlayer insulating film 35 that correspond to the interlayer insulating film contact holes 31, the well contact holes 40, and the source contact holes 41 are removed by using a photolithographic technique and a dry etching technique. Thereafter, an Al alloy or the like that serves as the source electrode pad 10, the gate electrode pad 11, and the gate finger 12 is formed by a sputtering method, and the gate electrode pad 11, and the gate finger 12 is formed by a sputtering method, and processed into a predetermined shape by a photolithographic technique. Additionally, an Al alloy or the like that serves as the drain electrode 90 is formed at the back surface side of the substrate 80 by a sputtering method.

In this manner, the power semiconductor device shown in FIG. 5 is manufactured.

In the power semiconductor device according to this embodiment, the low-resistance region 55 of n-type having a low resistance is provided on the surface layer of the first well region 50 that is located under the gate electrode pad 11. Therefore, at a time when the MOSFET is switched, and more particularly at a time when the MOSFET is switched from the ON state to the OFF state so that a drain voltage is rapidly increased, a voltage caused by a displacement current flowing from the first well region 50 having a larger area and the well contact hole 40 can be lowered. The displacement current occurs due to discharging of an electric charge accumulated in a source electrode pad 10 side of a depletion layer capacity that occurs between the first well region 50 and the drift layer 70 of n-type. Accordingly, occurrence of breakdown of the gate insulating film 32 that is in contact with the first well region 50 and has the gate electrode 21 provided thereon can be suppressed. Thus, a reliability of the power semiconductor device can be increased.

In the power semiconductor device according to this embodiment, no special configuration is provided for lowering a contact resistance between the source electrode pad 10 and the first and second well regions 50, 51. However, as shown in FIG. 13, for lowering the contact resistance between the source electrode pad 10 and the first and second well regions 50, 51, the p-contact region 52 having a low resistance and having a p-type impurity concentration of, for example, $1 \times 10^{21}$ $cm^{-3}$ or more may be provided on a surface layer of the second well region 51 located under the source contact hole 41 while the p-contact region 53 having a low resistance and having a p-type impurity concentration of, for example, $1 \times 10^{21}$ $cm^{-3}$ or more may be provided on the surface layer of the first well region 50 located under the well contact hole 40.

Providing the low-resistance p-contact regions 52 and 53 in this manner can lower a resistance of a current path extending from the first and second well regions 50, 51 to the source electrode pad 10 and further lower the voltage that occurs when the displacement current flows.

Although in the power semiconductor device according to this embodiment, the low-resistance region 55 is not directly connected to the well contact hole 40, the low-resistance region 55 may be connected to the well contact hole 40 as shown in FIG. 14. In this case, the source electrode pad 10 is in ohmic connect with the low-resistance region 55, too. At this time, a plan view of the configuration corresponding the cross-sectional view of FIG. 14 is, for example, as shown in FIG. 15.

Since the low-resistance region 55 is in direct contact with the well contact hole 40 in this manner, the junction between the first well region 50 and the low-resistance region 55 of n-type becomes the forward junction at the time when the MOSFET changes from the OFF state to the ON state to increase the drain voltage. Thus, the electric charge accumulated in the depletion layer in the OFF state easily flows from the first well region 50 to the low-resistance region 55, and the voltage occurring in the first well region 50 can be further lowered.

It is not always necessary that the low-resistance region 55 is shaped into one piece when seen above the upper surface. The low-resistance region 55 is provided for the purpose of suppressing the voltage that occurs when a current flows through a relatively long distance in a plane direction in the first well region 50 having a large area when seen above the upper surface. Therefore, the low-resistance region 55 may be provided in a grid pattern when seen above the upper surface as shown in FIG. 16 or may be provided in the shape of strips when seen above the upper surface as shown in FIG. 17, as long as the arrangement can prevent the current from flowing through a relatively long distance only in the first well region 50.

Figure 17:
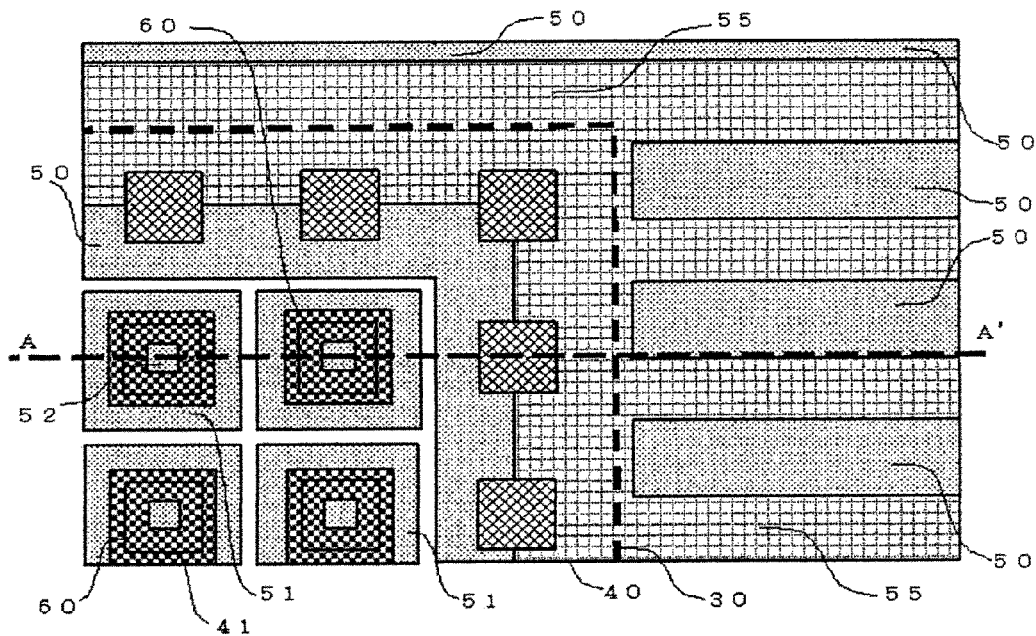
FIG. 17 is a plan view schematically showing a part of the power semiconductor device according to the embodiment 1 of the present invention.

Also in the power semiconductor devices shown in FIGS. 16 and 17, an in-plane resistance of the first well region 50 having a large area can be effectively lowered, so that the voltage occurring when the displacement current flows can be lowered. Thus, a voltage applied to the gate insulating film at a time of switching is lowered, and the power semiconductor device having a high reliability can be obtained.

(Embodiment 2)

Figure 18:
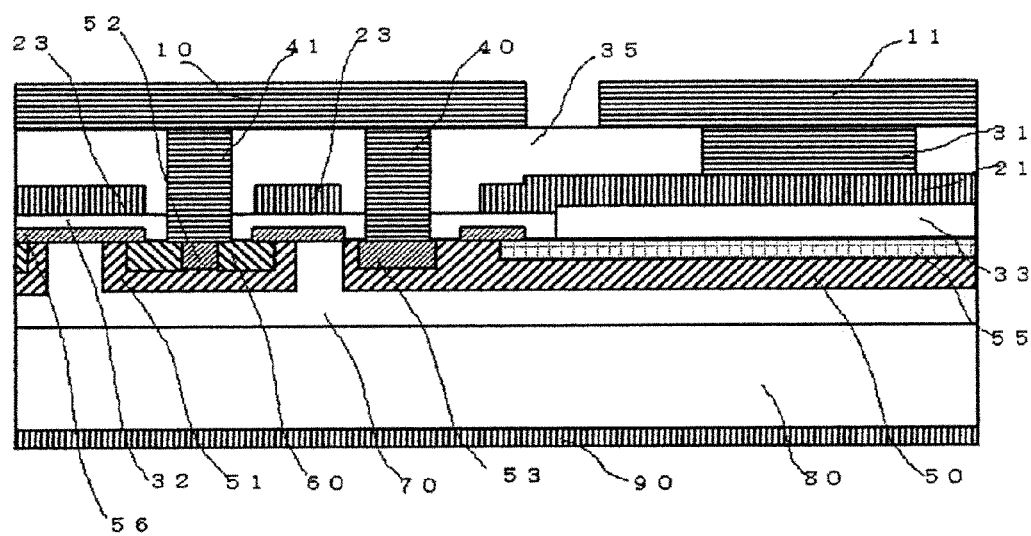
FIG. 18 is a plan view schematically showing a part of a power semiconductor device according to an embodiment 2 of the present invention.

FIG. 18 is a cross-sectional view schematically showing a cross-section of a power semiconductor device according to an embodiment 2 of the present invention. This embodiment is identical to the embodiment 1 except that a channel epitaxial layer 56 is provided, and therefore a detailed description of the identical parts is omitted.

Referring to FIG. 18, a channel epitaxial layer 56 of n-type that is made of silicon carbide having a relatively low impurity concentration is provided above the region made of the silicon carbide described in the embodiment 1. N which is an n-type impurity is added to the channel epitaxial layer 56, and the concentration thereof is set to approximately $5 \times 10^{16}$ $cm^{-3}$ to $2 \times 10^{17}$ $cm^{-3}$. The thickness thereof is set to approximately 0.1 to 0.5 μm. Above the region of the silicon carbide described in the embodiment 1, the channel epitaxial layer 56 is epitaxially grown on a silicon carbide region located thereunder by using a CVD apparatus and then formed by using a photolithographic technique and a dry etching technique. The channel epitaxial layer 56 is formed only in a region that mainly serves as a channel.

The p-contact regions 52 and 53 may be formed after the channel epitaxial layer 56 is formed and upper portions of the p-contact regions 52 and 53 are opened.

Also in the power semiconductor device according to this embodiment, a resistance of a current path extending from the first well region 50 having a large area to the source electrode pad 10 can be lowered, and a voltage that occurs when a displacement current flows can be lowered. Thus, a voltage applied to the gate insulating film at a time of switching is lowered, and the power semiconductor device having a high reliability can be obtained.

Figure 19:
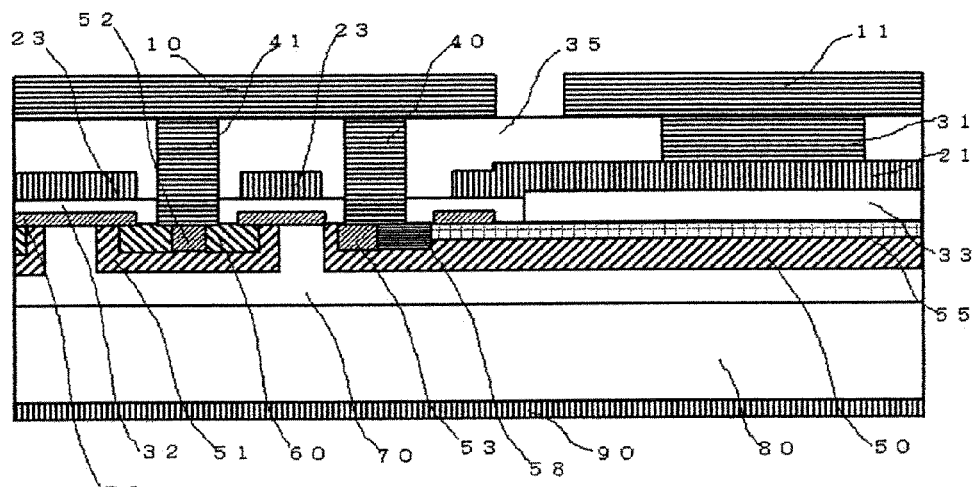
FIG. 19 is a cross-sectional view schematically showing a part of the power semiconductor device according to the embodiment 2 of the present invention.

To further lower the resistance of the current path connected from the low-resistance region 55 to the source electrode pad 10 through the well contact hole 40, an n-contact region 58 having a lower resistivity than that of the low-resistance region 55 may be provided in a portion of the low-resistance region 55 located under the well contact hole 40 as shown in FIG. 19. The n-contact region 58 is made of silicon carbide, and contains N, which is an n-type impurity, in approximately $1 \times 10^{18}$ cm$^{-3}$ to $2 \times 10^{20}$ cm$^{-3}$.

Providing the n-contact region 58 between the p-contact region 53 and the low-resistance region 55 as shown in FIG. 19 can reduce a resistance occurring between the low-resistance region 55 and the 10 source electrode pad, and can further lower the voltage that occurs when the displacement current flows.

(Embodiment 3)

Figure 20:
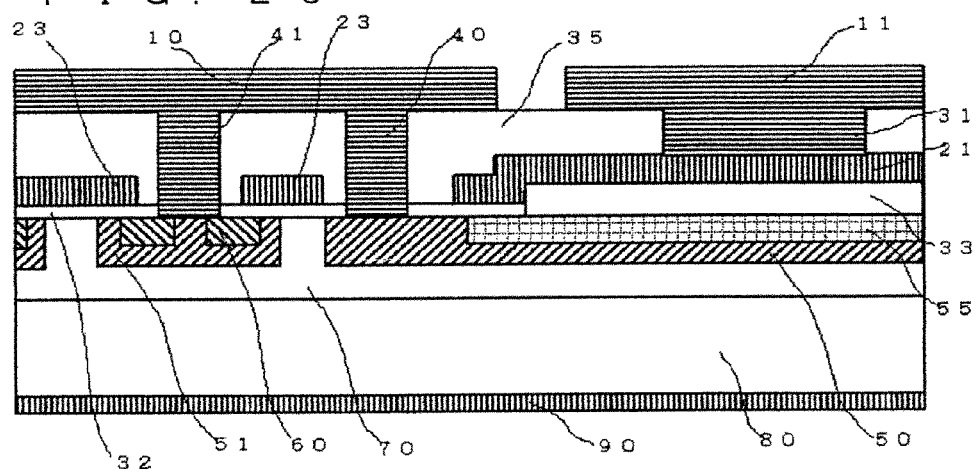
FIG. 20 is a cross-sectional view schematically showing a part of a power semiconductor device according to an embodiment 3 of the present invention.

FIG. 20 is a cross-sectional view schematically showing a cross-section of a power semiconductor device according to an embodiment 4 of the present invention. The power semiconductor device according to this embodiment is identical to that of the embodiment 1, except that the low-resistance region 55 and the source region 60 have the same thickness and the same impurity concentration. Therefore, a description of the identical parts is omitted.

In the power semiconductor device according to this embodiment, since the low-resistance region 55 and the source region 60 have the same thickness and the same impurity concentration, it is necessary that a thickness and an impurity concentration satisfy requirements for both of the low-resistance region 55 and the source region 60. Therefore, in the power semiconductor device according to this embodiment, the thickness of the low-resistance region 55 and the source region 60 should be smaller than the thickness of second well region 51, and approximately 0.1 to 1 μm. In the power semiconductor device according to this embodiment, the n-type impurity concentration of the low-resistance region 55 and the source region 60 should be higher than the p-type impurity concentration of the first well region 50 and the second well region 51, and approximately $1 \times 10^{18}$ cm$^{-3}$ to $1 \times 10^{21}$ cm$^{-3}$.

Figure 21:
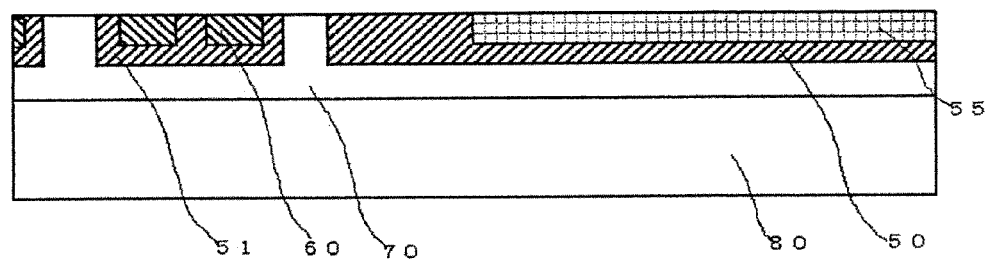
FIG. 21 is a cross-sectional view for explaining a manufacturing process of the power semiconductor device according to the embodiment 3 of the present invention.

Next, a method for manufacturing the power semiconductor device according to this embodiment will be described. To manufacture the power semiconductor device according to this embodiment, similarly to the power semiconductor device according to the embodiment 1, the process steps shown in FIGS. 6 to 8 of the embodiment 1 are performed, and then ion injection is performed to simultaneously form the low-resistance region 55 and the source region 60 such that the same impurity concentration and the same depth can be achieved as shown in FIG. 21. The other process steps are identical as those described with reference to FIGS. 11 and 12 of the embodiment 1, and therefore a detailed description is omitted.

In this manner, in the method for manufacturing the power semiconductor device according to the embodiment 3 of the present invention, the number of process steps may be the same as the number of process steps for manufacturing the power semiconductor device having no low-resistance region 55 in the first well region 50. Therefore, the voltage that occurs when the displacement current, which is caused in the first well region 50 having a large area at the time of switching the MOSFET, flows in the first well region 50 can be lowered without an increase in the manufacturing steps, thus suppressing occurrence of breakdown of the gate insulating film 32 that is in contact with the first well region 50 and has the gate electrode 21 provided thereon.

In the above-described embodiments 1 to 3, the power semiconductor device having the silicon carbide semiconductor is taken as an example. However, this is merely illustrative, and the same effects can be obtained by a power semiconductor device made of another material.

The invention claimed is:

1. A power semiconductor device comprising:
   a semiconductor substrate of a first conductivity type;
   a drift layer of the first conductivity type formed on a first main surface of said semiconductor substrate;
   a first well region of a second conductivity type formed in a part of a surface layer of said drift layer;
   a second well region of the second conductivity type formed in a part of the surface layer of said drift layer at a distance from said first well region, said second well region having a smaller area than that of said first well region when seen above an upper surface thereof;
   a low-resistance region of the first conductivity type formed in a surface layer of said first well region, said low-resistance region formed integrally or discretely so as to cover a region extending to most of said surface layer of said first well region and having a higher impurity concentration than that of said first well region;
   a gate insulating film formed on and in contact with surfaces of said first well region and said low-resistance region; and
   a gate electrode formed on and in contact with a surface of said gate insulating film; and
   a source electrode pad;
   a well contact hole connecting said first well region to said source electrode pad; and
   a source contact hole connecting said second well region to said source electrode pad,
   wherein in a region under said well contact hole, said source electrode pad and said low-resistance region are in contact with one another, a contact region having a higher impurity concentration than that of said low-resistance region is provided under said well contact hole.

2. The power semiconductor device according to claim 1, wherein
   said semiconductor substrate and said drift layer are made of silicon carbide.

3. The power semiconductor device according to claim 1, wherein
   said low-resistance region has an impurity concentration of $10^{18}$ cm$^{-3}$ or higher.

4. The power semiconductor device according to claim 1, further comprising a channel epitaxial layer.

5. A method for manufacturing a power semiconductor device, said method comprising the steps of:
   forming a drift layer of a first conductivity type on a first main surface of a semiconductor substrate of the first conductivity type;
   forming a first well region of a second conductivity type in a part of a surface layer of said drift layer;
   forming a second well region of the second conductivity type in a partial region of said surface layer of said drift layer at a distance from said first well region, said second well region having a smaller area than that of said first well region when seen above an upper surface thereof;
   forming a low-resistance region of the first conductivity type in a surface layer of said first well region, said low-resistance region formed integrally or discretely so as to cover a region extending to most of said surface layer of said first well region and having a higher impurity concentration than that of said first well region;
   forming a source region of the first conductivity type in a part of a surface layer of said second well region;
   forming a gate insulating film on and in contact with surfaces of said second well region, said source region, said first well region, and said low-resistance region;

forming a gate electrode on a surface of said gate insulating film;

connecting said first well region to a source electrode pad via a well contact hole;

connecting said second well region to a source electrode pad via a source contact hole; and forming a contact region having a higher impurity concentration than that of said low-resistance region in a region under said well contact hole and in contact with said source electrode pad and said low-resistance region.

6. The method for manufacturing a power semiconductor device according to claim 5, wherein said step of forming said low-resistance region and said step of forming said source region are simultaneously performed.

* * * * *